United States Patent
Janani et al.

(10) Patent No.: US 11,770,284 B1
(45) Date of Patent: Sep. 26, 2023

(54) PER CARRIER SCALING OF A CANCELLATION PULSE OF A MULTI-CARRIER SIGNAL

(71) Applicant: Meta Platforms, Inc., Menlo Park, CA (US)

(72) Inventors: Mohammad Janani, San Jose, CA (US); Djordje Tujkovic, Los Altos, CA (US)

(73) Assignee: Meta Platforms, Inc., Menlo Park, CA (US)

( * ) Notice: Subject to any disclaimer, the term of this patent is extended or adjusted under 35 U.S.C. 154(b) by 0 days.

(21) Appl. No.: 17/750,497

(22) Filed: May 23, 2022

(51) Int. Cl.
   *H04B 1/04* (2006.01)
   *H04L 27/26* (2006.01)
   *H04L 27/32* (2006.01)
   *H04L 27/34* (2006.01)

(52) U.S. Cl.
   CPC ...... *H04L 27/2623* (2013.01); *H04L 27/2618* (2013.01); *H04L 27/3411* (2013.01)

(58) Field of Classification Search
   CPC ............. H04L 27/2623; H04L 27/2618; H04L 27/3411; H04L 27/2624; H04L 27/26; H04B 1/0475; H04B 2001/0425; H03F 1/3241
   See application file for complete search history.

(56) References Cited

U.S. PATENT DOCUMENTS

| | | | |
|---|---|---|---|
| 7,486,738 B2 | 2/2009 | Trivedi | |
| 8,982,992 B2 | 3/2015 | Azadet et al. | |
| 9,054,928 B1 | 6/2015 | Copeland | |
| 9,521,024 B2 | 12/2016 | Wang | |
| 2014/0140452 A1* | 5/2014 | Gandhi | H03F 1/3241 375/346 |
| 2017/0187550 A1 | 6/2017 | Kim et al. | |
| 2018/0091348 A1* | 3/2018 | Agon | H04L 27/2647 |

FOREIGN PATENT DOCUMENTS

| | | |
|---|---|---|
| CN | 101453440 B | 5/2011 |
| CN | 102546498 A | 7/2012 |
| CN | 102223338 B | 10/2013 |

OTHER PUBLICATIONS

Mengali A., et al., "Low Complexity Transmit Processing for Multibeam Satellite Systems with Non-Linear Channels," 8th Advanced Satellite Multimedia Systems Conference, Sep. 7, 2016, 7 pages.

* cited by examiner

*Primary Examiner* — David S Huang
(74) *Attorney, Agent, or Firm* — BakerHostetler

(57) ABSTRACT

Apparatuses, methods, and systems for per carrier scaling of a cancellation pulse of a multi-carrier signal are disclosed. One method includes identifying a target PAPR (peak to average power ratio) for the multi-carrier signal, identifying a target EVM (error vector magnitude) for each of cj carriers of the multi-carrier signal, setting a scaling factor for each of the cj carrier to an initial value, or each carrier cj adjusting the scaling factor for the carrier cj until a measured EVM of the carrier cj satisfies the target EVM for the subcarrier cj while maintaining the PAPR target for the multi-carrier signal, and the cancellation pulse of the multi-carrier signal with the adjusted scaling factor for each of the cj carriers.

20 Claims, 9 Drawing Sheets

US 11,770,284 B1

PER CARRIER SCALING OF A CANCELLATION PULSE OF A MULTI-CARRIER SIGNAL

FIELD OF THE DESCRIBED EMBODIMENTS

The described embodiments relate generally to wireless communications. More particularly, the described embodiments relate to systems, methods, and apparatuses for per carrier scaling of a cancellation pulse of a multi-carrier signal.

BACKGROUND

Wireless communication techniques include both single-carrier modulations and multicarrier modulations. Single-carrier modulation systems exploit only one signal frequency to transmit data symbols. in contrast, multicarrier modulation systems divide a whole frequency channel into many subcarriers and the high-rate data stream is divided into many low-rate ones transmitted in parallel on subcarriers.

One form of multicarrier systems includes OFDM (orthogonal frequency divisions multiplexing) systems. OFDM is a form of signal modulation that divides a high data rate modulating stream placing them onto many slowly modulated narrowband close-spaced subcarriers, and in this way is less sensitive to frequency selective fading.

One disadvantage of OFDM systems is a high peak-to-average ratio (PAR) which can result in significant distortion when transmitted through power amplifiers. A common peak cancellation method is an attractive technique in crest factor reduction, but for OFDM signals.

It is desirable to have methods, apparatuses, and systems for per carrier scaling of a cancellation pulse of a multi-carrier signal to perform peak cancellation.

SUMMARY

An embodiment includes a method of a cancellation pulse of a multi-carrier signal. The method includes identifying a target PAPR (peak to average power ratio) for the multi-carrier signal, identifying a target EVM (error vector magnitude) for each of cj carriers of the multi-carrier signal, setting a scaling factor for each of the cj carrier to an initial value, or each carrier cj adjusting the scaling factor for the carrier cj until a measured EVM of the carrier cj satisfies the target EVM for the subcarrier cj while maintaining the PAPR target for the multi-carrier signal, and the cancellation pulse of the multi-carrier signal with the adjusted scaling factor for each of the cj carriers.

Another embodiment includes a multi-carrier signal transmitter, the multi-carrier signal transmitter including a multi-carrier signal generator and a controller. The multi-carrier signal generator is configured to generate a multi-carrier signal for transmission. The controller is configured to identify a target PAPR for the multi-carrier signal, identify a target EVM for each of cj carriers of the multi-carrier signal, set a scaling factor for each of the cj carrier to an initial value, for each carrier cj: adjust the scaling factor for the carrier cj until a measured EVM of the carrier cj satisfies the target EVM for the subcarrier cj while maintaining the PAPR target for the multi-carrier signal, and scale a cancellation pulse of the multi-carrier signal with the adjusted scaling factor for each of the cj carriers.

Other aspects and advantages of the described embodiments will become apparent from the following detailed description, taken in conjunction with the accompanying drawings, illustrating by way of example the principles of the described embodiments.

DETAILED DESCRIPTION

The embodiments described include methods, apparatuses, and systems for per carrier scaling of a cancellation pulse of a multi-carrier signal. For an embodiment, for each carrier cj of the multicarrier signal, a scaling factor is adjusted until a measured EVM of the carrier cj satisfies a target EVM for the subcarrier cj, while maintaining a PAPR target for the multi-carrier signal. Further, the cancellation pulse of the multi-carrier signal is scaled with the adjusted scaling factor for each of the cj carriers. The scaled cancellation pulse signal is summed with the multi-carrier signal, and a transmitter transmits the multi-carrier signal summed with the scaled cancellation pulse signal. For at least some embodiments, CFR (crest factor reduction) peak cancellation uses a cancellation pulse to reduce the PAPR. The described embodiments provide generation of a cancellation pulse.

Figure 1:
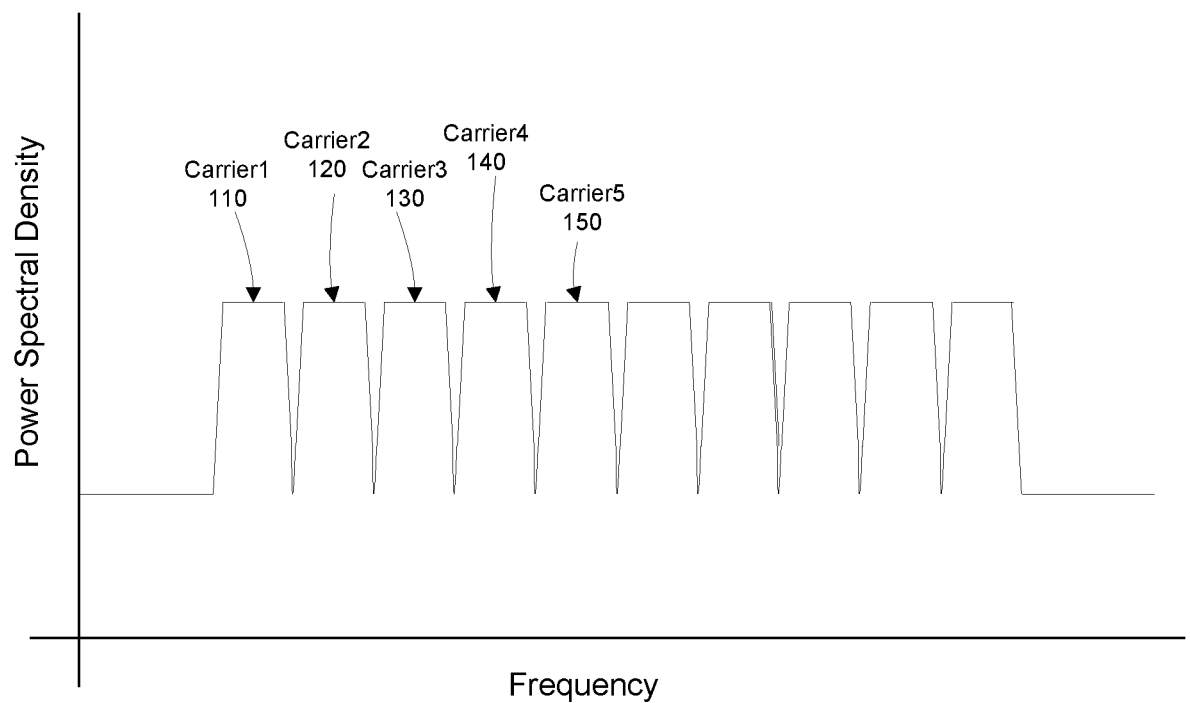
FIG. 1 shows a multi-carrier signal, according to an embodiment.

FIG. 1 shows a multicarrier signal, according to an embodiment. As shown, the multicarrier signal includes multiple carrier (sub-carrier) signals 110, 120, 130, 140, 150. Multi-carrier modulation (MCM) is a method of transmitting data by splitting the data into several components and transmitting each of these components over separate carrier signals. The individual carriers have narrow bandwidth, but the composite signal (multicarrier signal) can have a broad bandwidth. For an embodiment, each of the sub-carriers 110, 120, 130, 140, 150 carries digital information using I-Q modulation.

The advantages of MCM include relative immunity to fading caused by transmission over more than one path at a time (multipath fading), less susceptibility than single-carrier systems to interference caused by impulse noise, and enhanced immunity to inter-symbol interference. Limitations include difficulty in synchronizing the carriers under marginal conditions, and a relatively strict requirement that amplification be linear.

Figure 2:
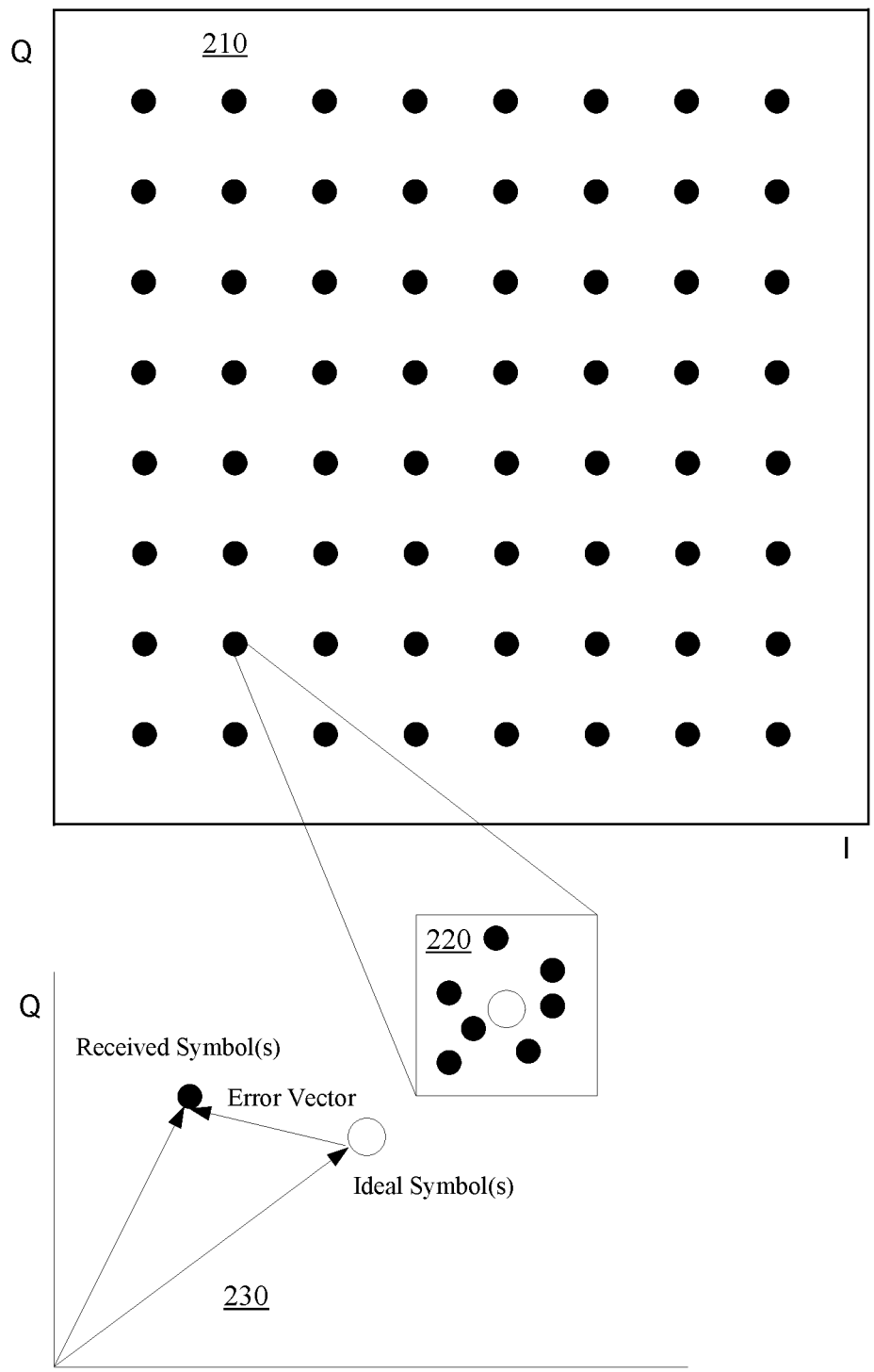
FIG. 2 shows an EVM (error vector magnitude) measurement of an I-Q signal, according to an embodiment.

FIG. 2 shows an EVM (error vector magnitude) measurement of an I-Q modulated signal, according to an embodiment. Plot 210 shows an I-Q representation of a 64 QAM (quadrature amplitude modulation) signal. Plot 220 shows a single I-Q modulated signal of the 64 QAM signal. Plot 230 shows an error vector of a single symbol. The error vector can be referred to as EVM (error vector magnitude).

An error vector magnitude or EVM (sometimes also called relative constellation error or RCE) is a measure used to quantify the performance of a digital radio transmitter or receiver. A signal sent by an ideal transmitter or received by a receiver has all constellation points precisely at the ideal locations. However, various imperfections in the implementation (such as carrier leakage, low image rejection ratio, phase noise etc.) cause the actual constellation points to deviate from the ideal locations. For an embodiment, EVM is a measure of how far the points are from the ideal locations.

Noise, distortion, spurious signals, and phase noise all degrade EVM, and therefore EVM provides a comprehensive measure of the quality of the radio receiver or transmitter for use in digital communications. Transmitter EVM can be measured by specialized equipment, which demodulates the received signal in a similar way to how a real radio demodulator does it. One of the stages in a typical phase-shift keying demodulation process produces a stream of I-Q points which can be used as a reasonably reliable estimate for the ideal transmitted signal in EVM calculation.

Figure 3:
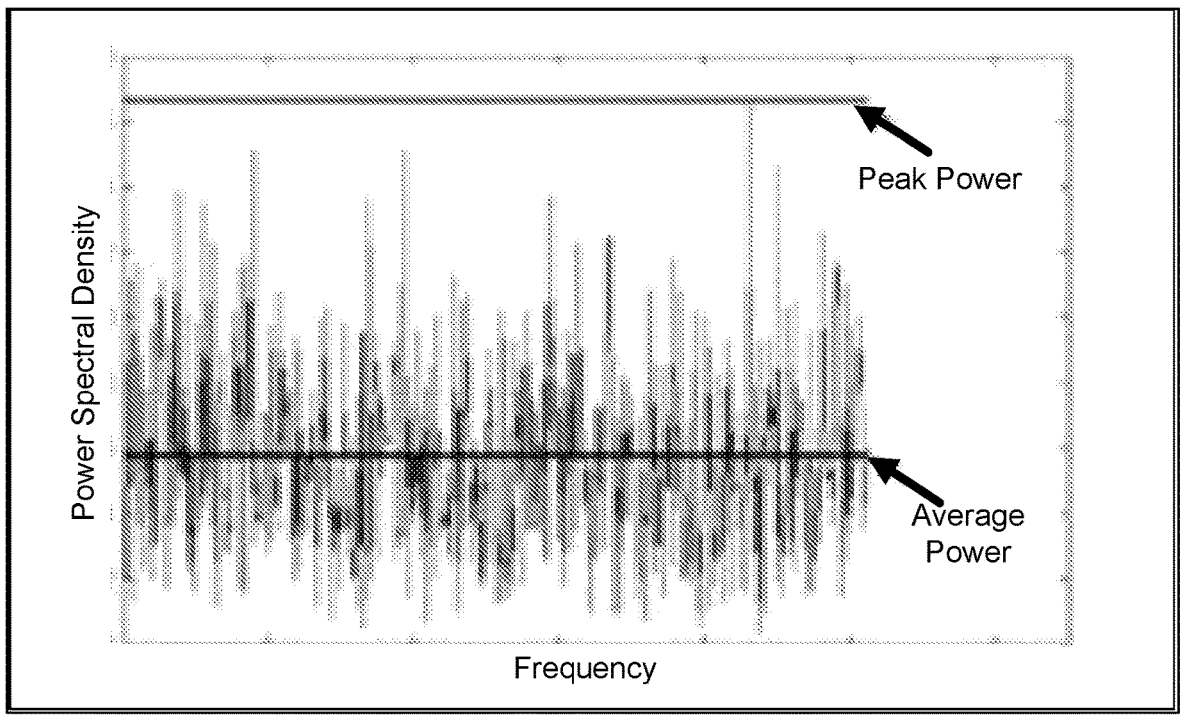
FIG. 3 shows a representation of PAPR (peak to average power ratio), according to an embodiment.

FIG. 3 shows a representation of PAPR (peak to average power ratio), according to an embodiment. One form of a multicarrier signal in an OFDM (orthogonal frequency division multiplexing). For an embodiment, the PAPR is a relation between the maximum power of a sample in an OFDM transmit symbol divided by the average power of that OFDM symbol. In simple terms, PAPR is the ratio of peak power to the average power of a signal, and can be expressed in the units of dB.

For an embodiment, PAPR occurs when in a multicarrier system the different sub-carriers are out of phase with each other. At each instant the sub-carriers are different with respect to each other at different phase values. When, for example, all the sub-carriers achieve a maximum value simultaneously, the output envelope may suddenly shoot up which causes a 'peak' in the output envelope. Due to presence of large number of independently modulated sub-carriers in an OFDM system, the peak value of the system can be very high as compared to the average of the whole system. This ratio of the peak to average power value is termed as Peak-to-Average Power Ratio.

Crest Factor Reduction (CFR) is a technique used to reduce the PAPR (Peak to Average Power Ratio) of the transmitted signal so that the power amplifier can operate more efficiently. In practice, there are different CFR algorithms, including clipping and Filtering, Peak Windowing, Peak Cancellation etc.

Cancellation Pulse

For at least some embodiments, cancellation pulse (CP) is used for controlling the PAPR of the multicarrier signal. For an embodiment, CP includes bandlimited pulses that can be used to cancel high peaks of the multicarrier signal which reduces the PAPR of the multicarrier signal. For an embodiment, pulses of the cancellation pulse are subtracted from peaks in an in-phase manner.

For an embodiment, multicarrier CFR cancellation pulse (CP) is implemented by frequency upconverting a single carrier PC. For an embodiment, a multicarrier PC is generated using each single-carrier cancellation pulse for a given carrier bandwidth as follows:

$$P_{c_j\text{-shifted}} = (e^{\left(j2\pi \tilde{n} \frac{f_{c_j}}{f_s}\right)}).*P_{c_j}$$

$$P_{multi} = \Sigma_{N_c} P_{c_j\text{-shifted}}$$

wherein $f_{c_j}$ is the center frequency of the cancellation pulse carrier center for carrier number $c_j$, $f_s$ is the sampling frequency, $P_{c_j}$ is the cancellation pulse for a single carrier number $c_j$, $P_{multi}$ is the cancellation pulse for multicarrier scenarios, $N_c$ is the total number of carriers, and '.*' is the dot product of two vectors.

At least some embodiments include a multicarrier CFR cancellation pulse that provides a way to customized EVM per carrier. This multicarrier CFR cancellation pulse is particularly useful when high constellation carriers with low EVM are required. At least some embodiments provide PC that customizes signal power boost per carrier. At least some embodiments provide PC customized signal power and customized EVM per carrier. At least some embodiments equalize unequal EVM per carriers over a wide frequency bandwidth. At least some embodiments provide PC in which PAPR remains the same for a given clipping rate. At least some embodiments redistribute the clipping noise in a customized way for multicarrier signals.

Figure 4A:
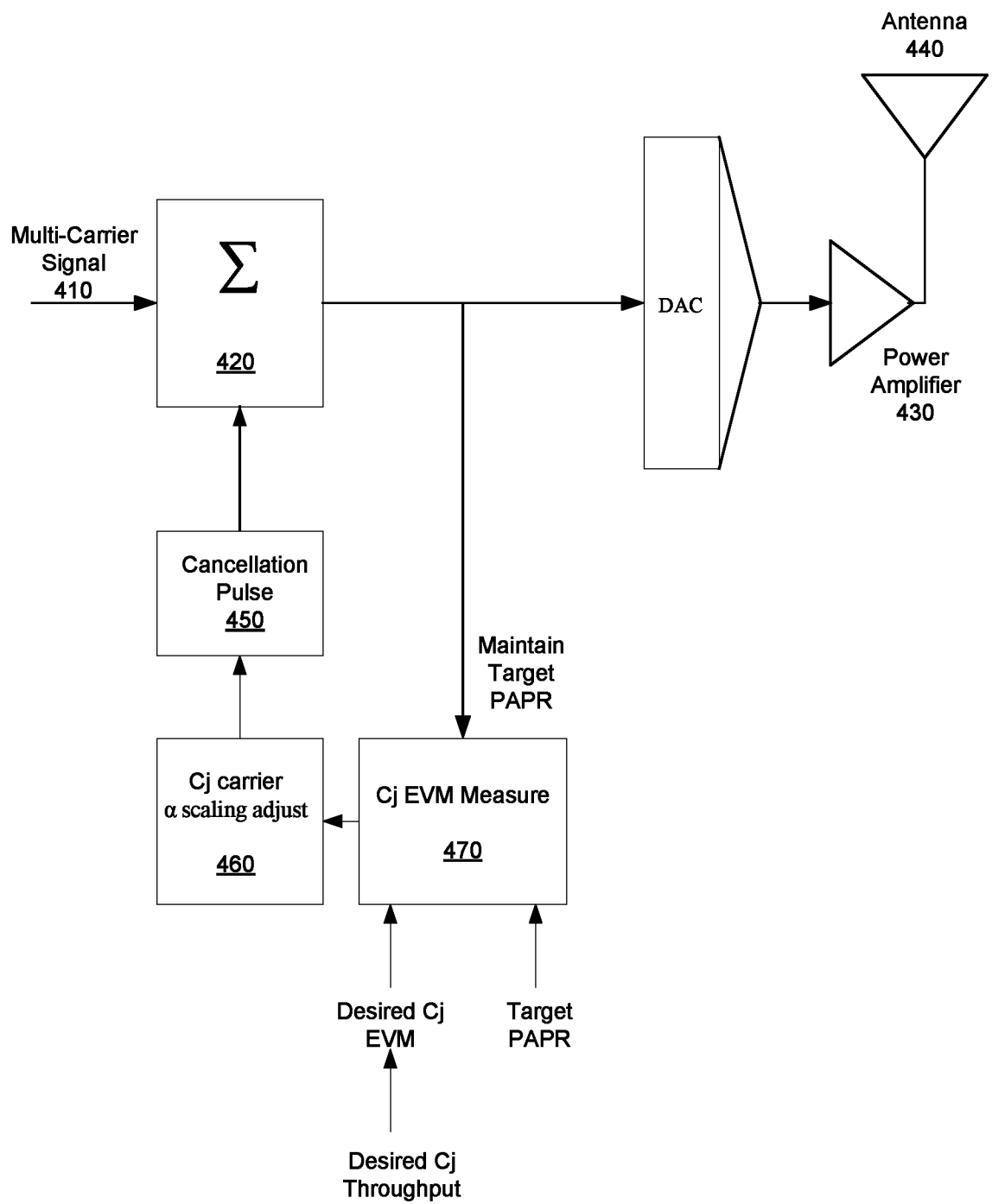
FIGS. 4A, 4B shows block diagrams of systems that provides per carrier scaling of a cancellation pulse of a multi-carrier signal, according to an embodiment.
Figure 4B:
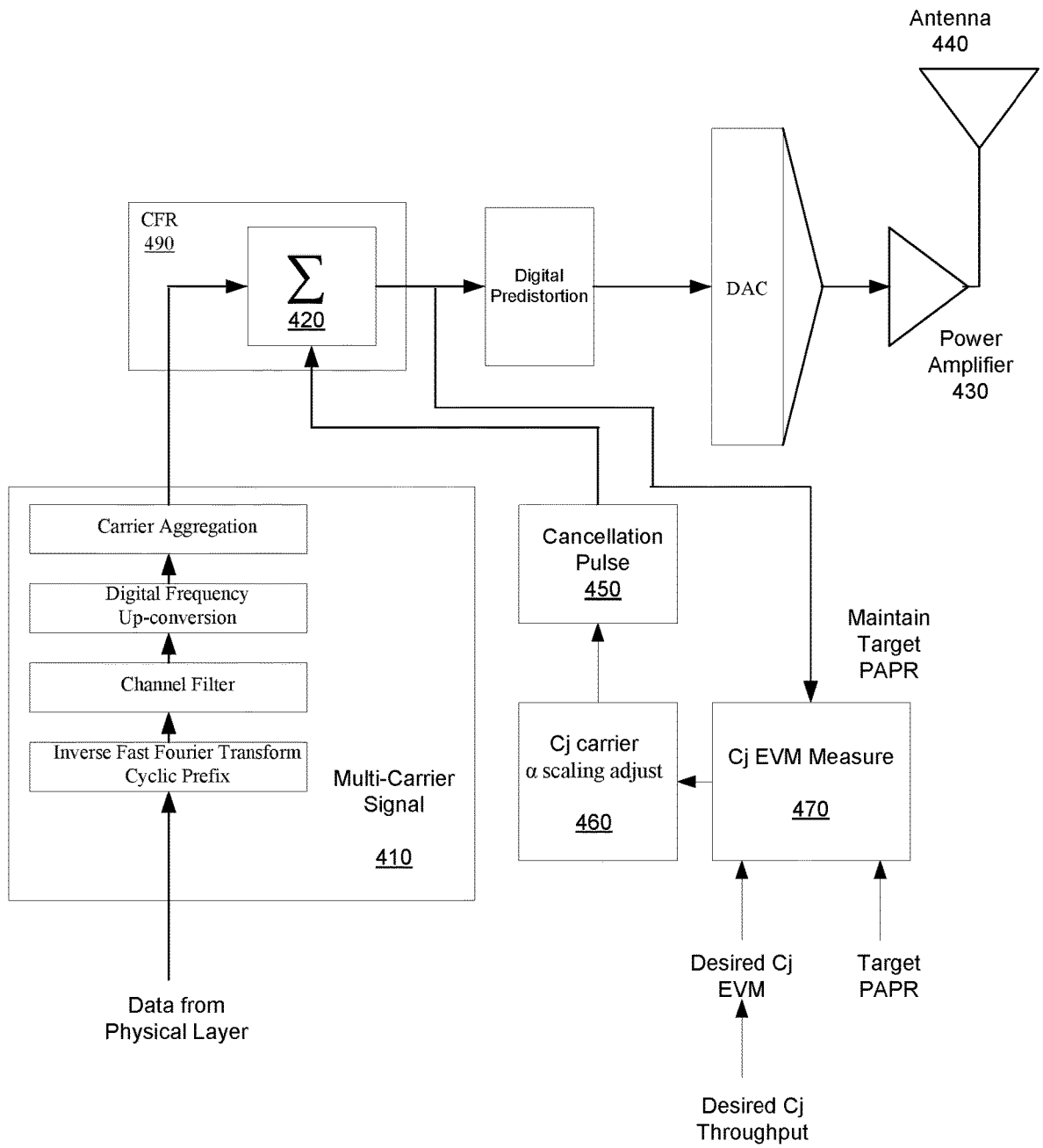

FIGS. 4A, 4B shows block diagrams of systems that provides per carrier scaling of a cancellation pulse of a multi-carrier signal, according to an embodiment. The systems include a transmitter or transceiver that generates a multicarrier signal 410 for transmission. However, before transmission, the multicarrier signal 410 is summed 420 with a cancellation pulse signal 450 to reduce the PAPR of the multicarrier signal before the multicarrier signal is amplified by a power amplifier 430. For the embodiment of FIG. 4B, the summing occurs within a CFR (crest factor reduction) block 490.

The systems operate to adjust a scaling 460 of each sub-carrier of the multicarrier signal while maintaining a desired value of PAPR of the multicarrier signal. For an embodiment, this includes adjusting a scaling ($\alpha$) 460 of each carrier cj of the cancellation pulse 450 before summing 420 the cancellation pulse signal with the multicarrier signal.

For an embodiment, a target PAPR for the multi-carrier signal is identified. For an embodiment, this target PAPR is maintained during the scaling of the carrier cj. For an embodiment, a target EVM for each of cj carriers of the multi-carrier signal is identified.

For an embodiment the scaling factor ($\alpha$) for each of the cj carrier is set to an initial value. Further, for an embodiment, the scaling factor for each carrier cj is adjusted until a measured EVM 470 of the carrier cj satisfies the target EVM for the subcarrier cj, while maintaining the PAPR target for the multi-carrier signal. The PAPR of the multi-carrier signal and an EVM 460 for one or more carriers cj is monitored during the scaling ($\alpha$) of each carrier cj. That is, the EVM 460 is monitored (measured 470) during the adjusted scaling ($\alpha$) 460 of each carrier cj of the cancellation pulse 450 while maintaining the desired value of the PAPR.

When the scaling factor 460 for each carrier cj has been selected to satisfy the desired EVM for each carrier cj while maintaining the PAPR, the cancellation pulse 450 of the multi-carrier signal is scaled with the adjusted scaling factor for each of the cj carriers. For an embodiment, the selected scaling factors form a 1×j vector, in which j is the number of sub- carriers of the multi-carrier signal. The scaling factor vector is applied to sub-carriers of the cancellation pulse signal before the cancellation pulse is summed with the multicarrier signal.

For an embodiment, the desired PAPR is selected to maintain distortion of the multicarrier signal by the power amplifier 430 below a threshold level of distortion.

For a multicarrier signal having $N_c$, subcarriers, the scaling factors form a 1×N vector $\vec{\alpha}$ that is used to scale up or down each of cancellation pulse per carrier differently. As stated, the PAPR of the multicarrier signal is maintained during the adjusting of the scaling factor ($\alpha$) of each of the subcarriers. For an embodiment, the required EVM limit (target EVM) for each carrier is selected based on the maximum constellation size that the carrier is to support. The bigger (larger) the size of the constellation the carrier is to support, the lower the required EVM required (target EVM). For an embodiment, the EVM threshold is defined by 3 GPP documents. For an embodiment, the target EVM is selected to be lower than the defined thresholds plus a margin. The margin can be preselected.

For an embodiment, the target EVM for each carrier of the multicarrier signal is selected based on the constellation each of the carriers is to support. Orthogonal Frequency-division multiplexing (OFDM) is a form of a multicarrier signal that is an attractive technique for high-bit-rate communication systems. OFDM has been widely used in modern wireless communication because of its high data rate, immunity to delay spread and frequency spectral efficiency and other advantages. Besides these advantages, one of the major drawbacks of OFDM is the high Peak-to-average-power ratio (PAPR) of the output signal of a transmitter, as PAPR restricts the system performance. For an embodiment, clipping is used to reduce the PAPR of the OFDM system, For an embodiment, clipping helps in reducing PAPR by clipping the peak value of the transmitted signal to a suitable threshold level if the peak value exceeds the threshold level.

For an embodiment, a clipping level is selected or adjusted to achieve an EVM target. For example, the clipping level may be increased to improve (lower) the EVM until the EVM is within a desired range, while maintaining the PAPR to avoid lowering power efficiency caused by increasing the PAPR. As described, adjusting the clipping level is a way to control EVM. However, by increasing the clipping level, the PAPR can increase as the EVM decreases. The increased PAPR due to the clipping can result in lower efficiency. The described embodiments provide for adjusting the EVM per given carriers without the need to change the clipping level. Therefore, the PAPR and power efficiency remain unchanged during the adjusting and selecting of the target EVM for each of the carriers.

At least some embodiments further include summing 420 the scaled cancellation pulse signal with the multi-carrier signal. Further, for an embodiment, a transmitter that includes the power amplifier 430 and the antenna 440 transmits the multi-carrier signal summed 420 with the scaled cancellation pulse signal.

The system of the described embodiments can be used for optimization of networks that include the system. For example, the system may be utilized within a cell of a cellular network, and the described embodiments can be used to boost or reduce power of the cell due to coverage planning, hand-over, interference management, and/or frequency reuse. Further, the described embodiment can be utilized to make some carriers of the multicarrier system to be high-capacity carriers that support high-constellations. The PAPR could be increased to achieve better (greater) EVM, but power efficiency is lost. The described embodiments allow for customization of some carriers to support higher constellation without changing PAPR, and therefore, is power efficient.

For transmission of multicarrier signals over very wideband spectrum, the EVM from carrier to carrier may vary. The described embodiment, allow for equalization of the EVM over a wideband spectrum, and further, accounts for the edge of bands of the wideband spectrum.

For some embodiments, some carriers of the multicarrier signals may suffer from interference. The described embodiments allow for adjustment of the EVM for carriers that are suffering from the interference.

The described embodiments provide for power and EVM adjustments of the carriers of the multicarrier signal. Accordingly, the power and EVM of limited coverage capacity carrier-cells can be adjusted to achieve better frequency reuse for a given carrier.

Figure 5:
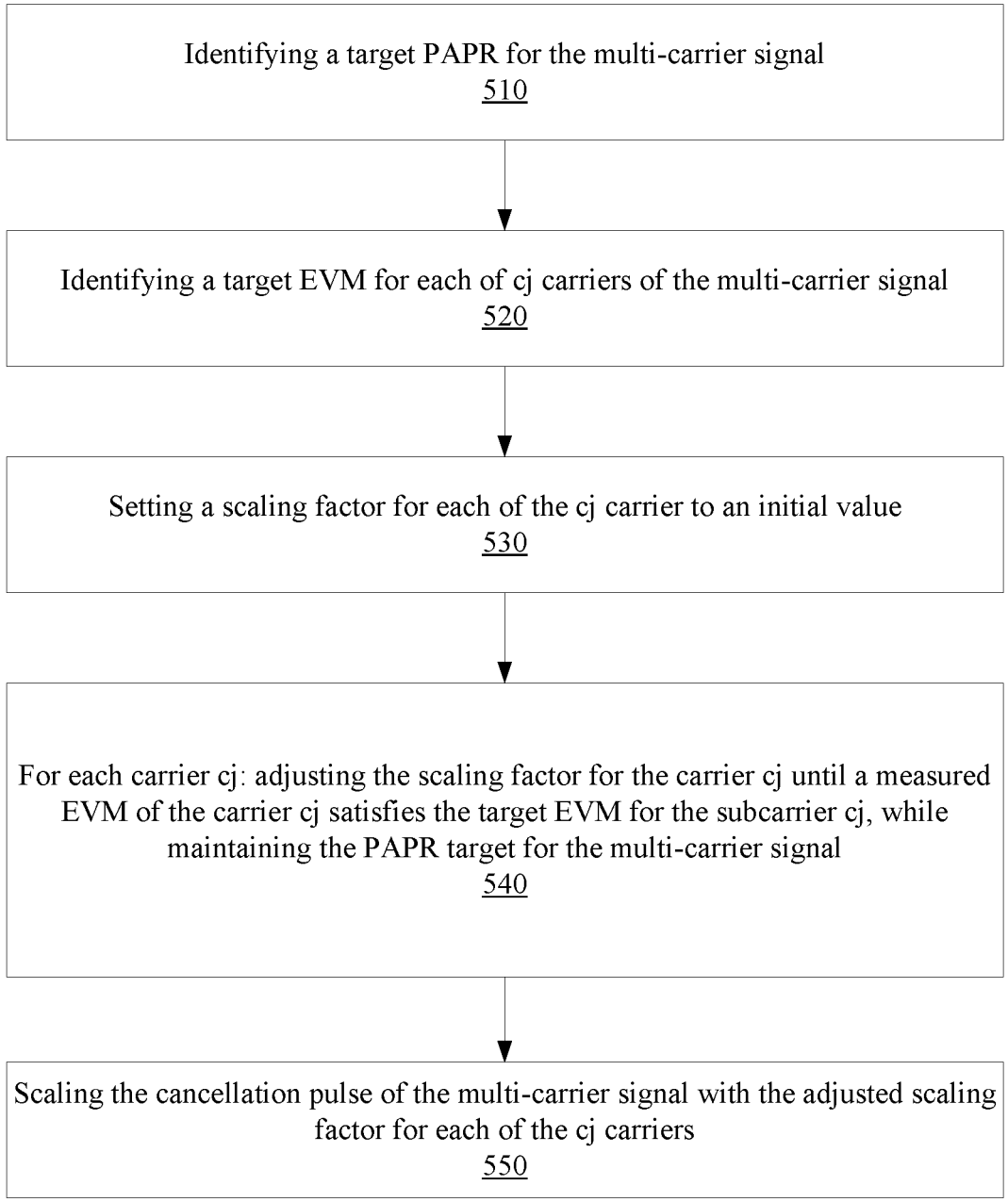
FIG. 5 shows a flow chart that includes steps of a method of per carrier scaling of a cancellation pulse of a multi-carrier signal, according to an embodiment.

FIG. 5 shows a flow chart that includes steps of a method of per carrier scaling of a cancellation pulse of a multicarrier signal, according to an embodiment. A first step 510 includes identifying a target PAPR for the multi-carrier signal. A second step 520 includes identifying a target EVM for each of cj carriers of the multi-carrier signal. A third step 530 includes setting a scaling factor (a) for each of the cj carrier to an initial value. A fourth step 540 includes for each carrier cj, adjusting the scaling factor (a) for the carrier cj until a measured EVM of the carrier cj satisfies the target EVM for the subcarrier cj, while maintaining the PAPR target for the multi-carrier signal. A fifth step 550 includes scaling the cancellation pulse of the multi-carrier signal with the adjusted scaling factor for each of the cj carriers.

As previously described, for a multicarrier signal having $N_c$ subcarriers, the scaling factors form a 1×N vector $\vec{\alpha}$ that is used to scale up or down each of cancellation pulse per carrier differently. As stated, the PAPR of the multicarrier signal is maintained during the adjusting of the scaling factor ($\alpha$) of each of the subcarriers.

As previously described, at least some embodiments further include summing the scaled cancellation pulse signal with the multi-carrier signal. Further, for an embodiment, a transmitter transmits the multi-carrier signal summed with the scaled cancellation pulse signal.

Mathematically, the multi-carrier signal summed with the scaled cancellation pulse signal can be represented by:

$$P_{multi} = \Theta_{carriers} P_{c_j\text{-}shifted} \otimes \alpha_{c_j}, \text{ wherein}$$

wherein the scaling factors ($\alpha_{c_j}$) define a vector a of size $N_c$ where each scaling factor operates to scale up or down each of cancellation pulse per carrier differently, where $\otimes$ indicates that all members of the cancellation pulse $P_{c_j\text{-}shifted}$ is multiplied by the same scaler $\alpha_{c_j}$.

For an embodiment, the vector $\vec{\alpha}$ operates to redistribute clipping noise between subcarriers. For an embodiment, $P_{c_j}$ can be any bandwidth and the multicarrier scenario are a combination of different carrier types having different bandwidths and power levels.

For at least some embodiments, the multicarrier cancellation pulse operates to boost the cancellation pulse of some carriers differently to achieve different EVM level. For example, the $\alpha_{c_j}$ of carrier $c_j$ can be reduced to be much lower than the other carriers to achieve a much lower EVM. For example, the $\alpha_{c_j}$ may be selected such that the carrier $c_j$ can support a higher constellation while the PAPR remain low.

For an embodiment, the target EVM for each of the cj carriers is selected based on a desired constellation of the cj carrier. As stated, the scaling factor ($\alpha$) for each of the cj carriers is selected to achieve the target EVM for each of the cj carriers. Accordingly, the scaling factor ($\alpha$) for each of the cj carriers is selected to achieve the desired constellation of the cj carrier. For an embodiment, the desired constellation of the cj carrier is selected based on desired throughput of the cj carrier.

For an embodiment, the target EVM for each of the cj carriers is selected to maintain a disparity across the cj carrier to within a disparity threshold. For an embodiment, the disparity threshold is selected based on an unlevel signal power density across the cj carriers, wherein the signal power density is unlevel when signal power spectral density across the cj carrier varies by greater than a power density threshold.

At least some embodiments further include readjusting the scaling factor for each of the carriers cj when a new PAPR for the multi-carrier signal is identified. At least some embodiments further include readjusting the scaling factor for each of the carriers cj when a new target EVM for one or more carrier cj the multi-carrier signal is identified. At least some embodiments further include readjusting the scaling factor for each of the carriers cj when a new desired constellation for one or more of the carriers cj is identified. At least some embodiments further include readjusting the scaling factor for each of the carriers cj when a data throughput for one or more of the carriers cj is identified.

It is to be understood that it may be possible that the scaling factor adjust may not be able to be completed while maintaining the PAPR target. Accordingly, for an embodiment, when adjusting the scaling factor for the carrier cj until a measured EVM of the carrier cj satisfies the target EVM for the subcarrier cj, while maintaining the PAPR target for the multi-carrier signal cannot be achieved, then identifying a new target PAPR target or a new target EVM for one or more of the cj carriers of the multi-carrier signal.

Figure 6:
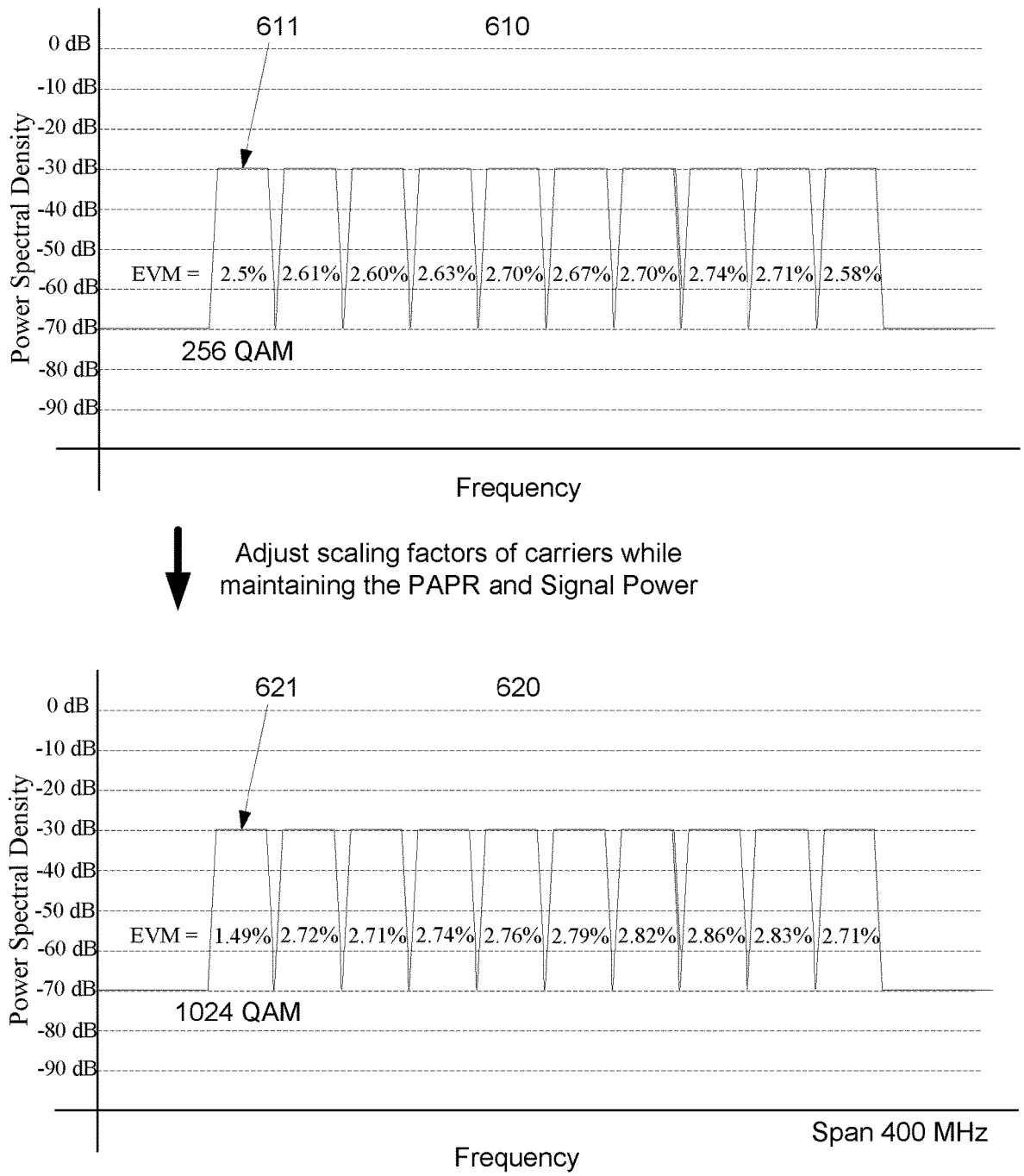
FIG. 6 shows a multi-carrier signal and per carrier scaling of a cancellation pulse of the multi-carrier signal, according to an embodiment.

FIG. 6 shows a multi-carrier signal and per carrier scaling of a cancellation pulse of the multi-carrier signal, according to an embodiment. For at least some embodiments, a high-capacity channel may be needed. A frequency spectrum 610 shows multicarrier signals wherein each carrier signal has a measured EVM. For example, the EVM of a first carrier signal 615 is 2.5%. As described, the EVM performance of a carrier signal provides an indication of the constellation that the carrier signal can support. For example, the first carrier signal 615 with an EVM of 2.5% may support a 256 QAM constellation.

Further, the described embodiments for cancellation pulse of a multi-carrier signal can improve the EVM of select carriers of the multicarrier signal. A frequency spectrum 620 shows the same multicarrier signal as 610 after adjusting the scaling factor for the carrier cj until a measured EVM of the carrier cj satisfies the target EVM for the subcarrier cj, while maintaining the PAPR target for the multi-carrier signal and scaling the cancellation pulse of the multi-carrier signal with the adjusted scaling factor for each of the cj carriers. Further, the scaled cancellation pulse signal is summed with the multi-carrier signal.

As shown, for the frequency spectrum 620 of multicarrier signal the first carrier signal 625 has an EVM of 1.49% which is lower than the EVM of 2.5% of the first carrier signal 615. Therefore, the first carrier 625 can support a higher constellation QAM signal, such as, 1024 QAM. It is to be noted that vary typically the EVMs of the other carriers of the multicarrier signal vary after cancellation pulse.

For at least some embodiments, the scaling factor for a carrier cj is adjusted until a measured EVM of the carrier cj satisfies the target EVM for the subcarrier cj, which allows the subcarrier cj to support a higher constellation, thereby providing higher throughput of wireless communications utilizing the subcarrier cj while maintaining the PAPR (not increasing) and not unduly (maintaining EVMS within a threshold value) penalizing the EVMS of the other carriers. Further, the EVM of the subcarriers cj at particular frequencies may be improved to combat interference at the particular frequencies.

Figure 7:
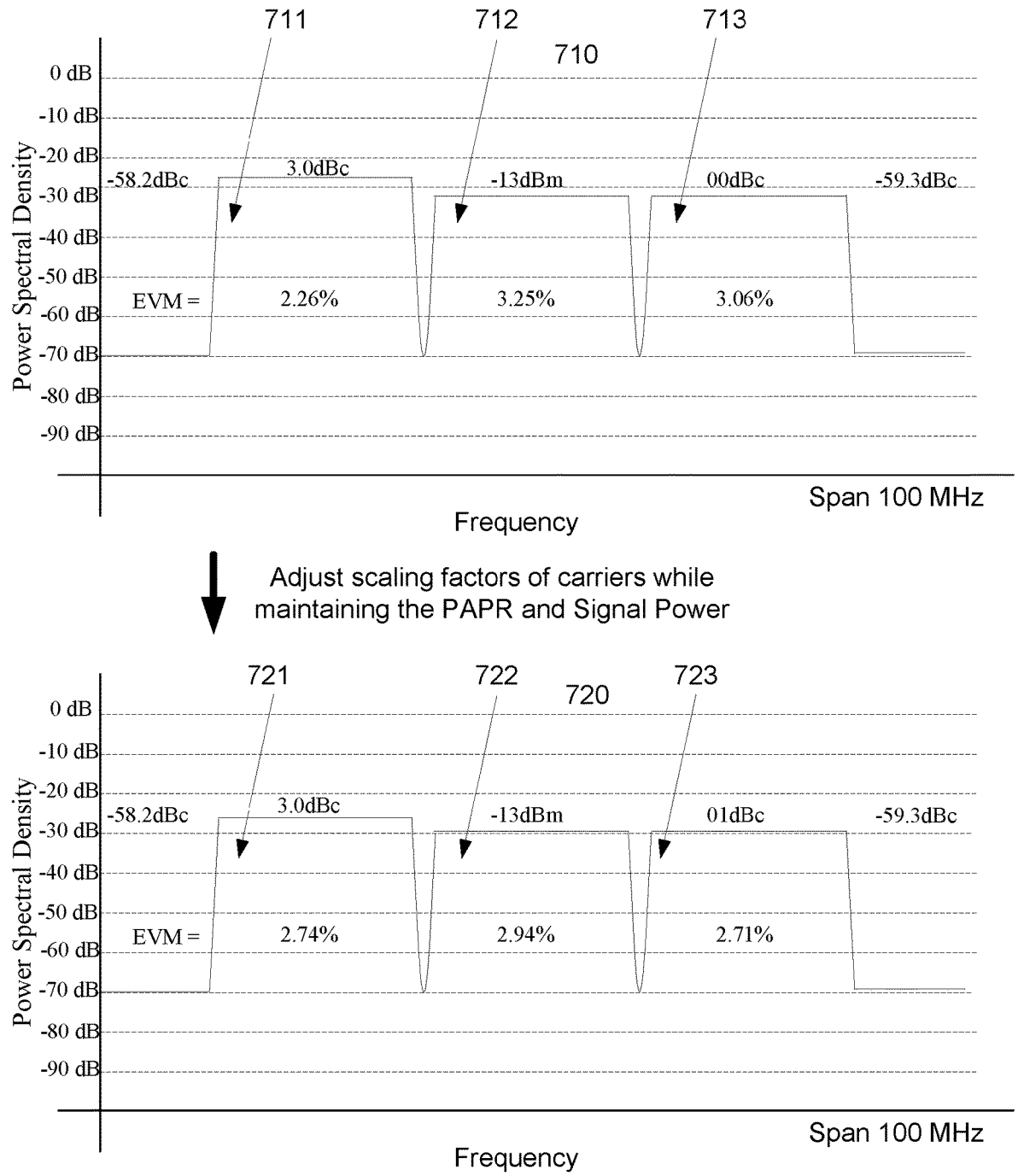
FIG. 7 shows a multi-carrier signal and per carrier scaling of a cancellation pulse of the multi-carrier signal, according to another embodiment.

FIG. 7 shows a multi-carrier signal and per carrier scaling of cancellation pulse of the multi-carrier signal, according to another embodiment. The frequency spectrum 710 of FIG. 7 shows a first carrier 711, a second carrier 712, and a third carrier 713. The signal power level of the first carrier 711 is 3 db greater than the signal power level of the other two carriers 712, 713.

A least some of the described embodiments for adjusting the scaling factor for the carrier cj until a measured EVM of the carrier cj satisfies the target EVM for the subcarrier cj, while maintaining the PAPR target for the multi-carrier signal and scaling the cancellation pulse of the multi-carrier signal with the adjusted scaling factor for each of the cj carriers is used to either boost or to reduce power of some carriers. This embodiment can be utilized when different carrier types have a different bandwidth or when the power density is unlevel over the carriers. At least some of the described embodiment can be utilized to mitigate the unlevel EVM due to unlevel signal power density.

The frequency spectrum 720 shows the carriers 721, 722, 723 after adjusting the scaling factors for each of the carriers. As previously noted, the signal power level of the first carrier 711 is 3 db greater than the signal power level of the other two carriers 712, 713. However, after adjusting the scaling factor for the carriers, the EVM of the second carrier 722 is improved to 2.94%, the third carrier 723 is improved to 2.71%, while the first carrier 721 is only degraded to 2.74%. It is to be realized that if only a conventional CFR cancellation pulse process was used in which all carriers have an equal level of reduction, the EVM of the carriers would be much more unbalanced.

Figure 8:
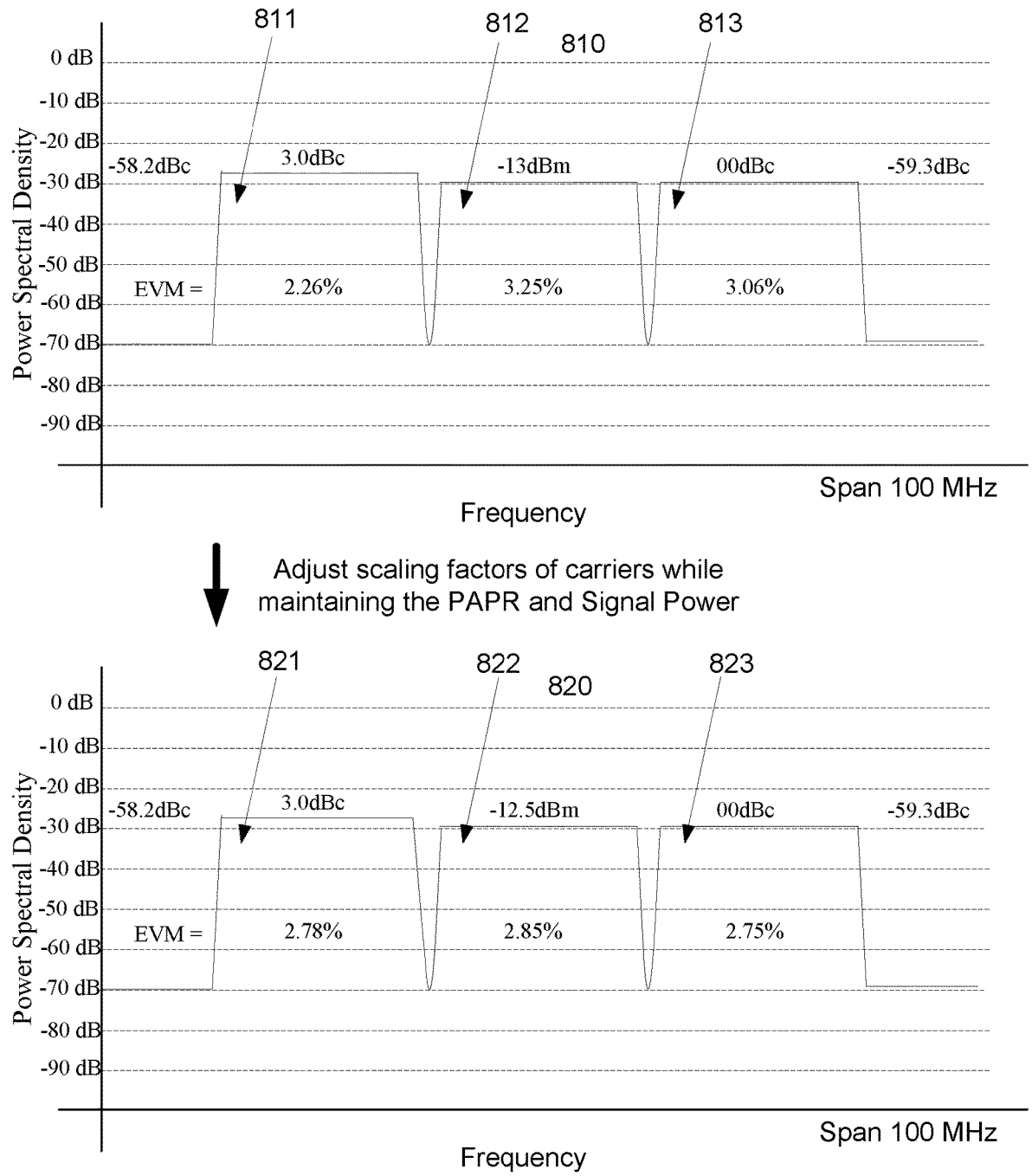
FIGS. 8 shows a multi-carrier signal and per carrier scaling of a cancellation pulse of the multi-carrier signal, according to another embodiment.

FIGS. 8 shows a multi-carrier signal and per carrier scaling of a cancellation pulse of the multi-carrier signal, according to another embodiment. In situations in which the carriers carry wide (200 MHz or more) bandwidth communication signals the EVMs of the multicarrier signal can be particularly variable over the carriers. As previously described, the scaling factors of the carriers of the multi-carrier signal can be adjusted in order to provide the carriers with EVMs that are all within a threshold value of each other.

The frequency spectrum 810 that includes the carriers 811, 812, 813 is the same as the frequency spectrum 710 that includes the carriers 711, 712, 713. However, the frequency spectrum 820 that includes the carriers 821, 822, 823 has EVMs for the different carriers that are within a small range of different values. The difference is that the carrier 821 has been power scaled as well. That is, the signal power of the carrier 812 is −13 dBm, whereas the signal power of the carrier 822 is −12.5 dBm.

Although specific embodiments have been described and illustrated, the embodiments are not to be limited to the specific forms or arrangements of parts so described and illustrated. The described embodiments are to only be limited by the claims.

What is claimed:

1. A method of a cancellation pulse of a multi-carrier signal, comprising:
   identifying a target peak-to-average-power ratio (PAPR) for the multi-carrier signal;
   identifying a target error vector magnitude (EVM) for cj carriers of the multi-carrier signal;
   setting a scaling factor for each of the cj carriers to an initial value;
   for the cj carriers:
      adjusting the scaling factor for the carrier cj until a measured EVM of the carrier cj satisfies the target EVM for a subcarrier cj, while maintaining the PAPR target for the multi-carrier signal; and
   scaling the cancellation pulse of the multi-carrier signal with the adjusting of the scaling factor for the cj carriers, resulting in a scaled cancellation pulse.

2. The method of claim 1, further comprising:
   summing the scaled cancellation pulse with the multi-carrier signal; and
   transmitting, by a transmitter, the multi-carrier signal summed with the scaled cancellation pulse.

3. The method of claim 1, wherein the target EVM for the cj carriers is selected based on a desired constellation of a cj carrier.

4. The method of claim 3, wherein the desired constellation of the cj carrier is selected based on desired throughput of the cj carrier.

5. The method of claim 1, wherein the target EVM for the cj carriers is selected to maintain a disparity across a cj carrier to within a disparity threshold.

6. The method of claim 5, wherein the disparity threshold is selected based on an unlevel signal power density across the cj carriers, wherein the signal power density is unlevel when signal power spectral density across the cj carrier varies by greater than a power density threshold.

7. The method of claim 1, further comprising readjusting the scaling factor for the cj carriers when a new PAPR for the multi-carrier signal is identified.

8. The method of claim 1, further comprising readjusting the scaling factor for the cj carriers when a new target EVM for one or more of the cj carriers of the multi-carrier signal is identified.

9. The method of claim 1, further comprising readjusting the scaling factor for the cj carriers when a new desired constellation for one or more of the cj carriers is identified.

10. The method of claim 1, further comprising readjusting the scaling factor for the cj carriers when a data throughput for one or more of the cj carriers is identified.

11. The method of claim 1, wherein adjusting the scaling factor for the cj carriers until a measured EVM of the cj carriers satisfies the target EVM for the subcarrier cj, while maintaining the PAPR target for the multi-carrier signal cannot be achieved, then identifying a new target PAPR target or a new target EVM for one or more of the cj carriers of the multi-carrier signal.

12. A multi-carrier signal transmitter comprising:
   a multi-carrier signal generator configured to generate a multi-carrier signal for transmission; and
   a controller configured to;
      identify a target peak-to-average-power ratio (PAPR) for the multi-carrier signal;
      identify a target error vector magnitude (EVM) for cj carriers of the multi-carrier signal;
      set a scaling factor for the cj carriers to an initial value;
      for the cj carriers:
         adjust the scaling factor for the cj carriers until a measured EVM of the cj carriers satisfies the target EVM for a subcarrier cj while maintaining the PAPR target for the multi-carrier signal; and
         scale a cancellation pulse of the multi-carrier signal with the adjusted scaling factor for the cj carriers, resulting in a scaled cancellation pulse.

13. The transmitter of claim 12, wherein the controller is further configured to sum the scaled cancellation pulse with the multi-carrier signal; and
   the transmitter is configured to transmit the multi-carrier signal summed with the scaled cancellation pulse.

14. The transmitter of claim 12, wherein the target EVM for the cj carriers is selected based on a desired constellation of a cj carrier.

15. The transmitter of claim 12, wherein the target EVM for the cj carriers is selected to maintain a disparity across a cj carrier to within a disparity threshold.

16. The transmitter of claim 15, wherein the disparity threshold is selected based on an unlevel signal power density across the cj carriers, wherein the signal power density is unlevel when signal power spectral density across the cj carrier varies by greater than a power density threshold.

17. The transmitter of claim 12, further comprising readjusting the scaling factor for the cj carriers when a new PAPR for the multi-carrier signal is identified.

18. The transmitter of claim 12, further comprising readjusting the scaling factor for the cj carriers when a new target EVM for one or more of the cj carriers of the multi-carrier signal is identified.

19. The transmitter of claim 12, further comprising readjusting the scaling factor for the cj carriers when a new desired constellation for one or more of the cj carriers is identified.

20. The transmitter of claim 12, wherein adjust the scaling factor for the cj carriers until a measured EVM of the cj carriers satisfies the target EVM for the subcarrier cj, while maintaining the PAPR target for the multi-carrier signal cannot be achieved, then identifying a new target PAPR target or a new target EVM for one or more of the cj carriers of the multi-carrier signal.

* * * * *